United States Patent

Sun et al.

[11] Patent Number: 6,160,317
[45] Date of Patent: Dec. 12, 2000

[54] METHOD OF SPACER FORMATION AND SOURCE PROTECTION AFTER SELF-ALIGNED SOURCE FORMED AND A DEVICE PROVIDED BY SUCH A METHOD

[75] Inventors: Yu Sun, Saratoga; Chi Chang, Redwood City; Mark T. Ramsbey, Sunnyvale, all of Calif.

[73] Assignee: Advanced Micro Devices, Inc., Sunnyvale, Calif.

[21] Appl. No.: 09/336,057

[22] Filed: Jun. 18, 1999

Related U.S. Application Data

[62] Division of application No. 08/813,562, Mar. 7, 1997, Pat. No. 5,933,730.

[51] Int. Cl.[7] .................................................. H01L 27/088
[52] U.S. Cl. ............................................ 257/900; 257/346
[58] Field of Search .................................... 257/900, 408, 257/346

[56] References Cited

U.S. PATENT DOCUMENTS 5,933,730  8/1999  Sun et al. .................................. 438/241

FOREIGN PATENT DOCUMENTS

4219973  8/1992  Japan ...................................... 257/900

*Primary Examiner*—Mark V. Prenty
*Attorney, Agent, or Firm*—Sawyer Law Group LLP

[57] ABSTRACT

The present invention provides a semiconductor device and a method for providing such a semiconductor device which allows a field oxide etch while minimizing the damage to the silicon. This method is particularly useful for smaller semiconductor devices, for example, such as a semiconductor device utilizing core source spacing less than 0.4 microns. A method according to the present invention for providing a semiconductor device comprises the steps of depositing a first spacer oxide layer over a core area and a peripheral area of a semiconductor device; etching the first spacer oxide layer at the source side of core cell area; depositing a second spacer oxide layer over the core area and the peripheral area, and etching the first and second spacer oxide layers over the peripheral area only.

6 Claims, 11 Drawing Sheets

Core Area                           Peripheral Area

METHOD OF SPACER FORMATION AND SOURCE PROTECTION AFTER SELF-ALIGNED SOURCE FORMED AND A DEVICE PROVIDED BY SUCH A METHOD

The present application is a divisional of U.S. Ser. No. 08/813,562 filed Mar. 7, 1997 now U.S. Pat. No. 5,933,730.

FIELD OF THE INVENTION

The present invention relates to semiconductor processing techniques and more particularly to self-aligned source (SAS) processing techniques.

BACKGROUND OF THE INVENTION

Semiconductor devices typically include a drain contact, a gate, and a source contact associated with each cell of a memory array. The memory array typically including a plurality of wordlines intersected with a plurality of bitlines. In producing semiconductor devices, and more particularly FLASH memory devices, the architecture of the device should allow current to flow from the drain contact to the gate and into the source contact In making this connection, a gap is typically required in the field oxide which is utilized to isolate individual FLASH memory cells in an array of memory cells.

In past architectures, the field oxide was not made to be continuous. The field oxide stopped after a wordline in order to allow the current to pass through. However, as memory cells become progressively smaller, this method becomes progressively more difficult to perform due to a minimum field oxide size requirement to accommodate misalignment of the gate and also due to requirements of the oxide gap size in order to let the current flow through.

Another approach is to utilize a continuous field oxide, then remove a portion of the continuous field oxide to allow the current to flow through. However, other problems arise due to the additional etching step required to remove the field oxide. Since the memory array typically alternates silicon and oxide, when the oxide is etched, then the silicon is also typically exposed to the etch. Although the etching material typically has a high selectivity, i.e., the oxide is etched much faster than the silicon, some of the silicon will still be etched away. When the silicon is damaged, reliability problems can be created for the FLASH memory device.

One solution is presented in U.S. Pat. No. 5,470,773 issued Nov. 28, 1995, to Liu et al. In the Liu patent, a method is described in which oxide spacers on the side wall of the gate is utilized to reduce the area of damage to the silicon. Although the Liu method works well for many applications, as the memory cells become smaller, the space between the gates become narrower. Consequently, it becomes more difficult to place spacers next to the gate.

An additional parameter to be met is that the spacer width typically needs to be a certain width as determined by transistor performance for n-channel, p-channel and electronic sensitive device (ESD) transistors used in the peripheral circuit. To meet this parameter, oxide spacer deposition can be performed in multiple stages. For instance, a first spacer oxide may be deposited at half the required spacer width. Then, the first spacer is etched in the core area only and a second spacer oxide may be deposited. Thereafter, both spacer oxides are etched together in the periphery circuit, but only the second spacer oxide will be etched in core area.

Although this method appears to work well for some cells, such as source spacing in cells wider than 0.4 microns, the second oxide spacer layer may, however, be pinched between gates for source spacing in cells smaller than 0.4 microns. Another problem associated with this method is caused by the first layer of oxide spacer on the peripheral circuit not being etched and protected by a photoresist, while the first layer of oxide spacer on the core area of the memory are being etched. Consequently, when the second layer of oxide spacer is etched, the peripheral circuit will have double the thickness of oxide spacer than the core area of the memory. When the first half of the oxide spacer in the periphery area are etched away, the etch for the remaining half of the oxide spacer in the periphery area now begins to etch the silicon in the core area, since the core area only has half the thickness of the oxide spacer in the peripheral area. Consequently, the damaged silicon creeps closer to the edge of the gate.

Accordingly, what is needed is a semiconductor device and a method for providing such a semiconductor device which causes a gap in the field oxide to allow the current to flow through, while minimizing the damage caused to the silicon by the field oxide etching process. The present invention addresses such a need.

SUMMARY

The present invention provides a semiconductor device and a method for providing such a semiconductor device which allows a field oxide etch while minimizing the damage to the silicon. This method is particularly useful for smaller semiconductor devices, for example, such as a semiconductor device utilizing core cell with source spacing less than 0.4 microns.

A method according to the present invention for providing a semiconductor device comprises the steps of depositing a first spacer oxide layer over a core area and a peripheral area of a semiconductor device; etching the first spacer oxide layer; depositing a second spacer oxide layer over the core area and the peripheral area, and etching the first and second spacer oxide layers over the peripheral area.

DETAILED DESCRIPTION

The present invention relates to an improvement in semiconductor devices, and a method for providing such semiconductor devices. The following description is presented to enable one of ordinary skill in the art to make and use the illustrative embodiment and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
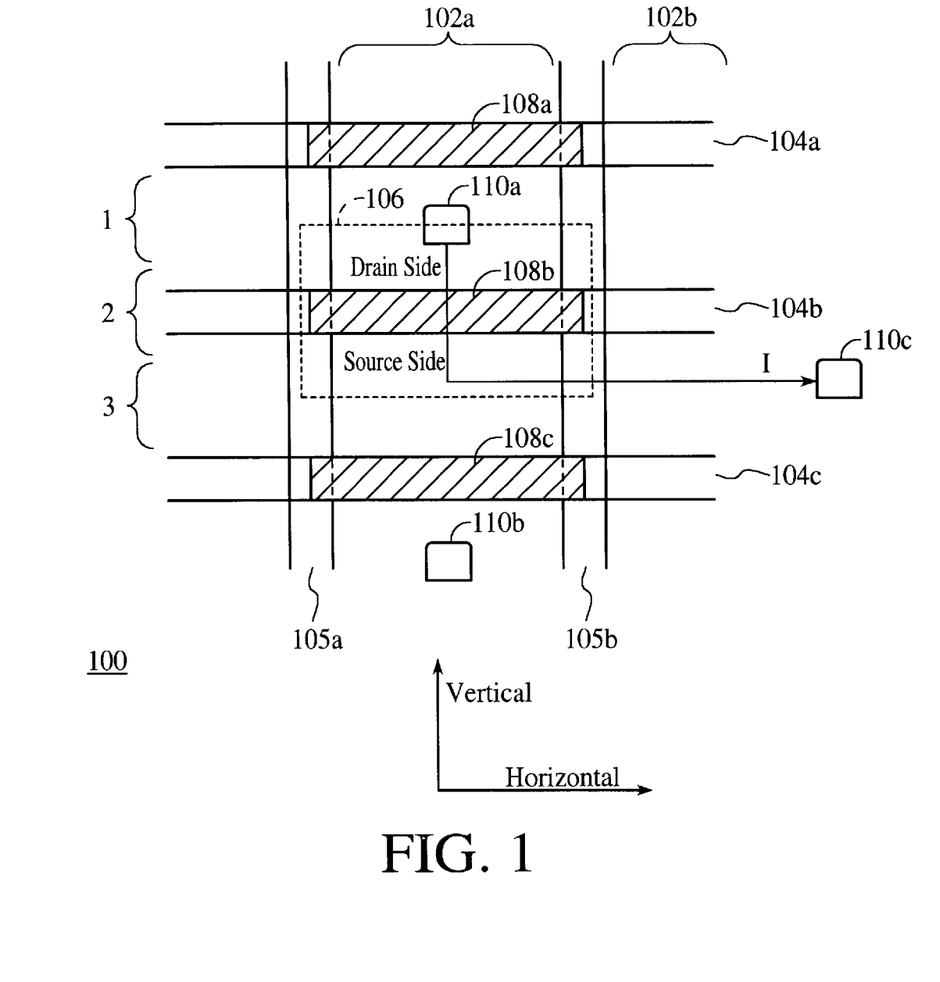
FIG. 1 is a block diagram of a portion of a memory array.

FIG. 1 is a block diagram of a portion of a memory cell array 100. It includes a plurality of bitlines 102a–102b intersected with a plurality of wordlines 104a–104c. Portions of a floating gate 108a–108c can be seen along the wordlines 104a–104c. A single cell 106 is outlined in the array. When a cell, such as cell 106, is selected, a current flows from the drain contact 110a to a source contact 110c. In order for the current to flow from the drain contact 110a to the source contact 110c, the current must pass through the bit to bit isolation 105b area in which field oxide is located. Since field oxide is used to isolate memory cells from each other, it will typically not allow a current to flow through it.

Figure 2:
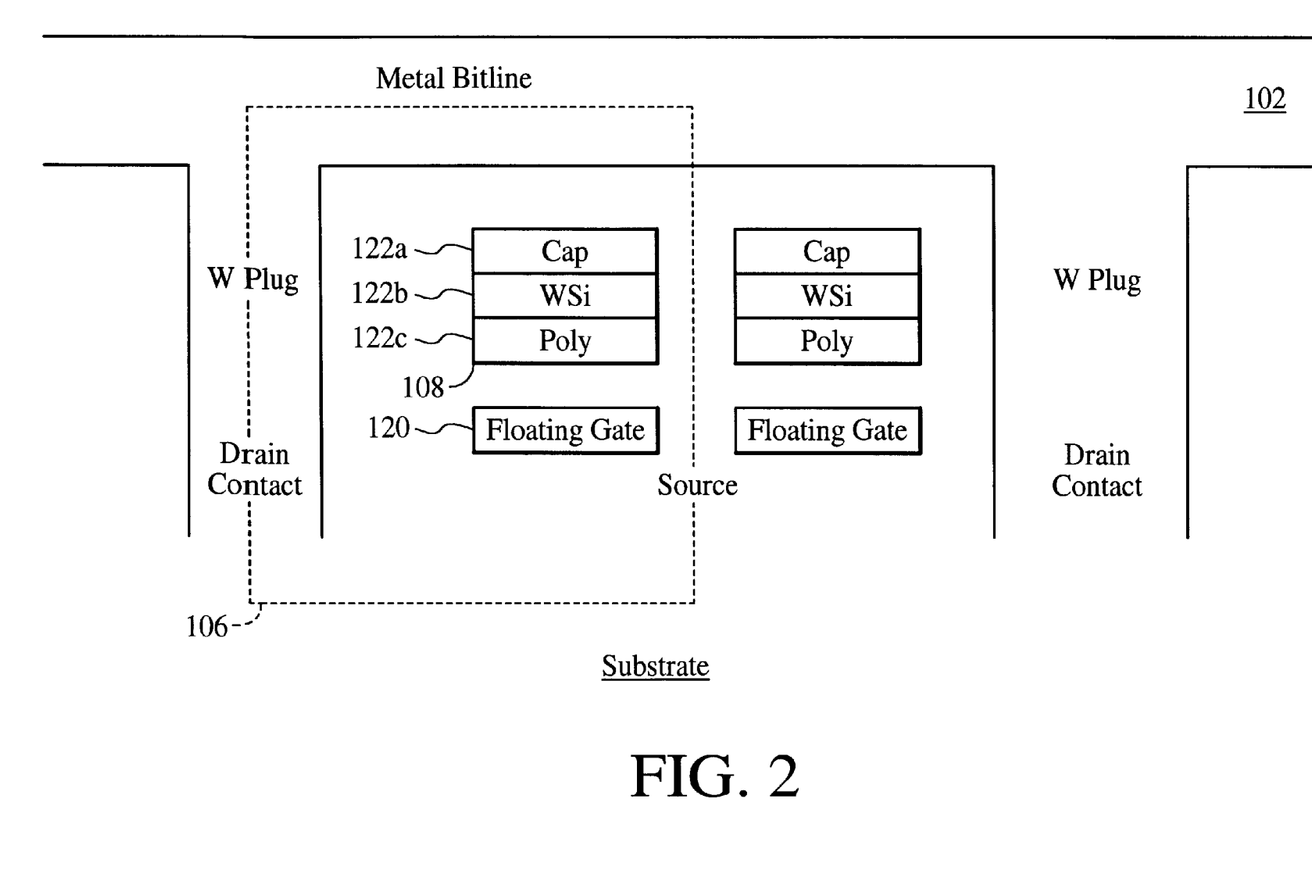
FIG. 2 shows a vertical cross-section of the memory array shown in FIG. 1.

FIG. 2 shows a vertical cross-section of the memory array 100 shown in FIG. 1. The metal bitline 102 is shown above the cell 106. Within the cell 106 is the control gate 108 which typically includes a cap layer 122a, a tungsten silicon layer 122b, and a poly or amorphous silicon layer 122c. Beneath the control gate 108 is the floating gate 120. The gates are flanked by the drain contact and the source.

Figure 3A:
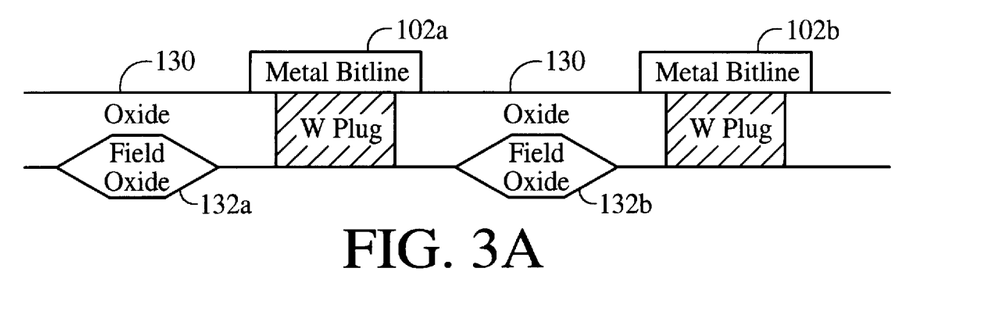
FIGS. 3A–3C show a cross-section of the memory array of sections 1–3, respectively, of FIG. 1.
Figure 3B:
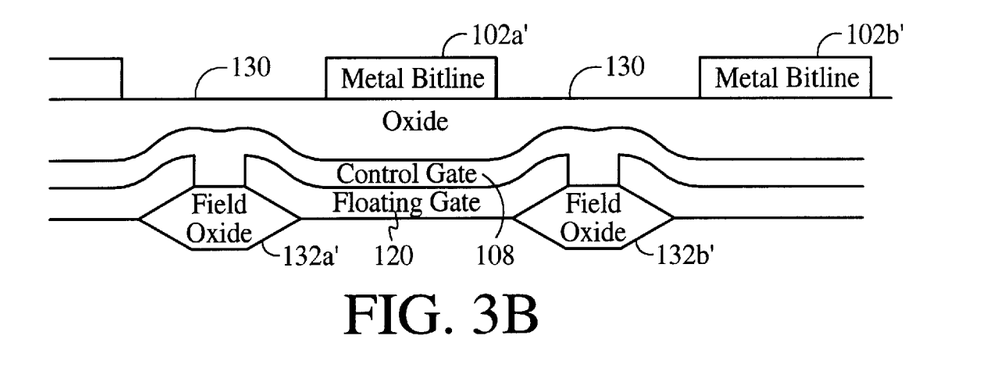
Figure 3C:
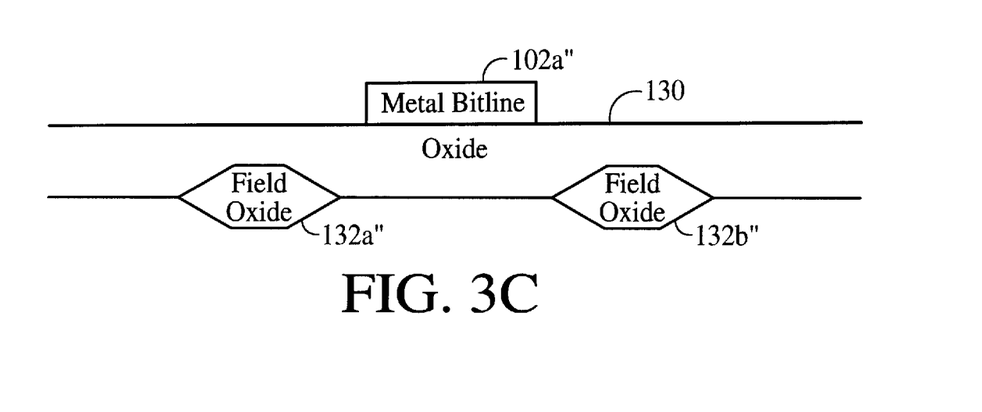

FIGS. 3a–3c show a horizontal cross-section of the memory array 100 of sections 1–3, respectively, of FIG. 1. FIG. 3a is a cross-sectional view of section 1 of the memory array 100 shown in FIG. 1. Field oxide 132a–132b are shown below oxide 130 with metal bitlines 102a—102b above and between the field oxides 132.

FIG. 3b shows a cross-sectional view of section 2 of the memory array 100 shown in FIG. 1. The field oxide 132a'–132d' are shown with floating gate 120 situated between them. The control gate 108 is positioned above the floating gate 120. Above the control gate 108, oxide 130 is situated, upon which metal bitline 102a'–102b' are situated.

FIG. 3c shows a cross-sectional view of section 3 of the memory array 100 shown in FIG. 1. Field oxide 132a"–132b" are shown with oxide 130 situated above them. The metal bitlines 102a" is shown above the oxide 130 and between the field oxide 132a"–132b".

As previously discussed, in prior art architectures, the field oxide was initially not continuous to allow the current to flow from the drain contact 110a, shown in FIG. 1, to the source contact 110c. As semiconductor devices became smaller, a new solution was required. The new solution was to utilize a continuous field oxide, portions of which would be removed to allow the current to flow through. However, removing the field oxide creates an extra step which has been known to cause problems as the semiconductor devices continually shrink in size.

Figure 4:
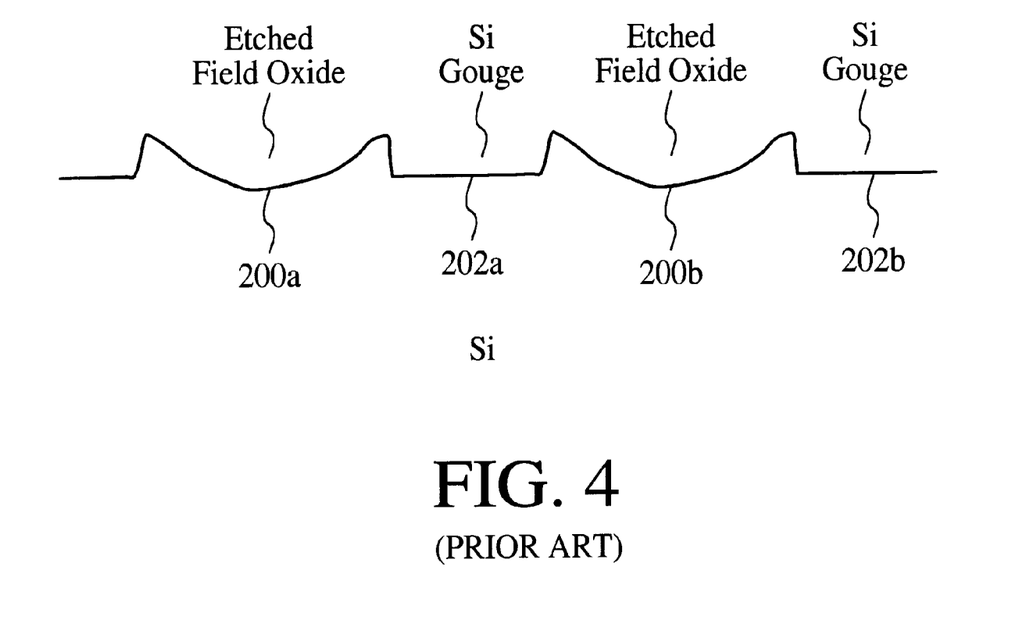
FIG. 4 is a diagram of the cross-section shown in FIG. 3C after the etching of a portion of the field oxide.

FIG. 4 is a diagram of the cross-section shown in FIG. 3C after the etching of a portion of the field oxide. FIG. 4 shows that portions of the field oxide are etched in areas 200a and 200b. However, in addition to the field oxide being exposed to the etching material, the silicon is also exposed to the etching process, as is shown by gouged areas of silicon in areas 202a and 202b.

Figure 5:
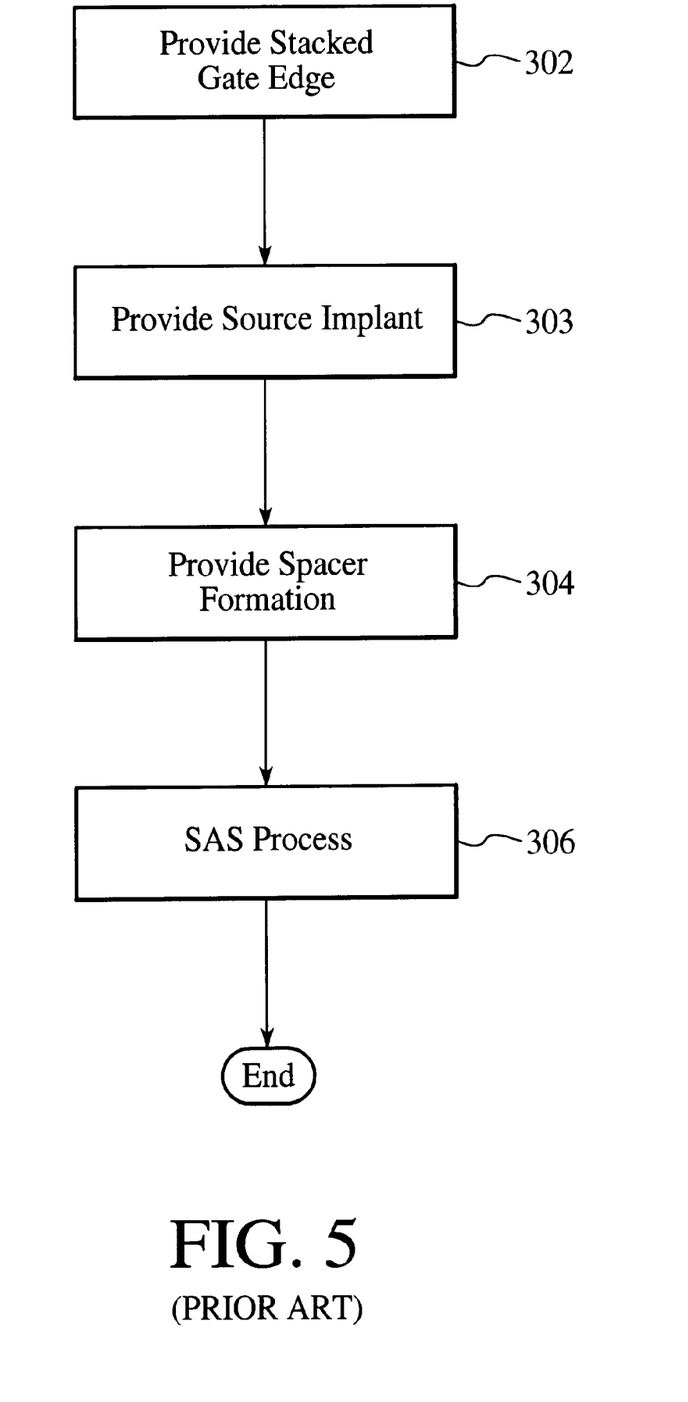
FIG. 5 is a simple flow diagram illustrating a conventional method.

FIG. 5 is a simple flow diagram illustrating the method presented in U.S. Pat. No. 5,470,773 issued Nov. 28, 1995 to Liu et al. Accordingly, this process comprises providing a stacked gate edge, via step 302. Source implant is performed along with the drain implant via step 303. The spacer formation is then provided via step 304. Thereafter, the self-aligned source etch is provided, via step 306. This way, any damage that occurs due to SAS etch is placed away the stacked gate edge, thus tunnel oxide and source doping profiles are both protected.

Figure 6:
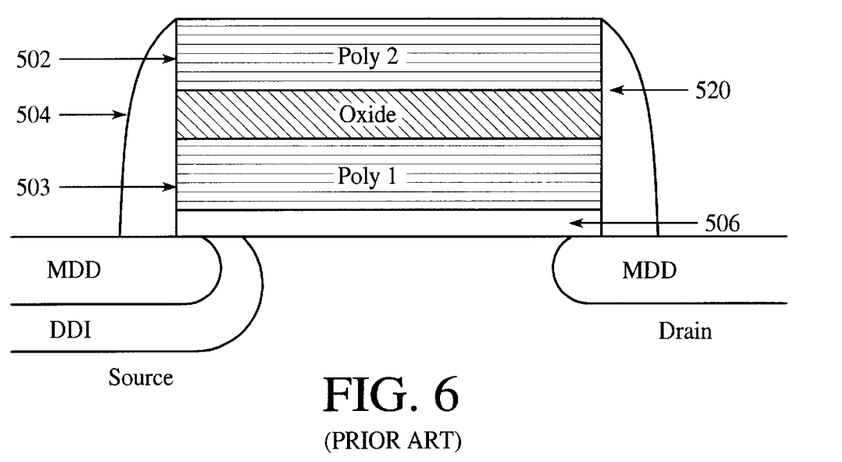
FIGS. 6 and 7 are cross-sections of the core cell during the conventional method.
Figure 7:
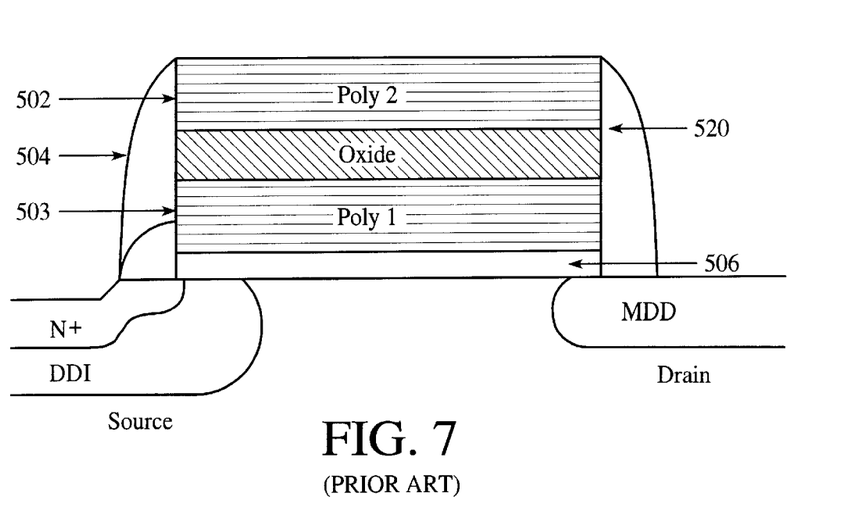

Cross-sections of the core cell during the Liu method are shown in FIGS. 6 and 7. The stacked gate edge 502 and the tunnel oxide 506 are protected by the spacer formation 504. Thereafter, the process for providing SAS etch can then occur. The cross-section of the resulting cell will look like that shown in FIG. 7. In this cell, the tunnel oxide integrity is improved and there is a uniform source region under the source overlap area since the implant is placed before SAS etch and due to the protection by the spacer formation 504. Accordingly, a uniform source region is provided under the gate.

Although this prior method works well for many applications, it becomes more difficult to apply this method as semiconductor devices become smaller. For instance, this method works well with source spacing in cells wider than 0.6 microns, however, with source spacing in cells smaller than 0.6 microns, the method according to the present invention is a better method to apply to these smaller sized semiconductor devices.

Figure 8:
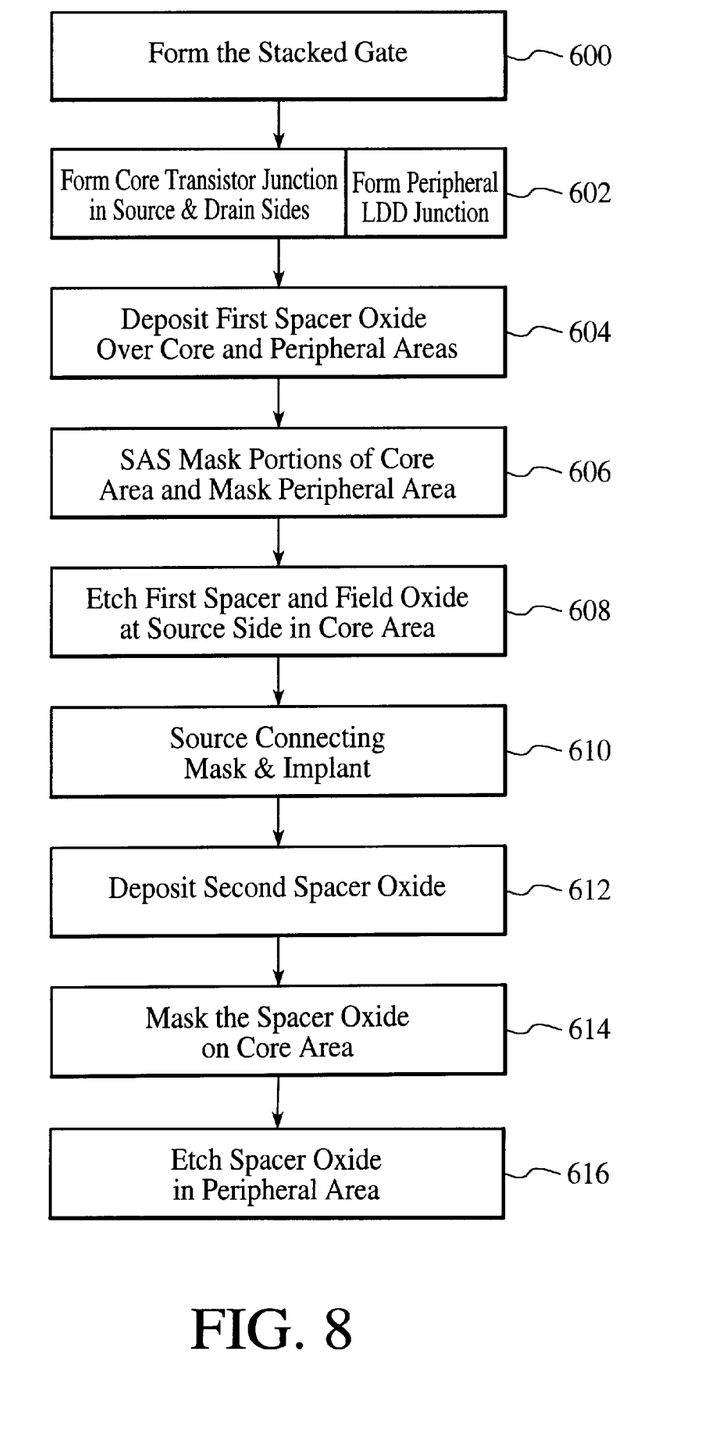
FIG. 8 is a flow diagram of a method according to the present invention.

A method according to the present invention is shown in the flow diagram of FIG. 8. The stacked gate is formed via step 600. Thereafter, core transistor junction is formed in the source and drain side in the core area of the substrate, via step 602. Additionally, peripheral LDD junctions are formed in the peripheral area via step 602. A first spacer oxide is deposited over core and peripheral areas via step 604. Thereafter, portions of the core area are masked and substantially all of the peripheral area is masked via step 606. The first spacer and the field oxide is then etched at the source side in the core area via step 608.

Portions of the core area are again masked, as well as substantially all of the peripheral area, via step 610. Additionally, the core area is implanted via step 610. A second spacer oxide is then deposited over both the core area and the peripheral area via step 612. The spacer oxide on the core area is then substantially completely masked via step 614, while the peripheral area remains unmasked. The spacer oxide in the peripheral area is then etched via step 616.

Figure 9A:
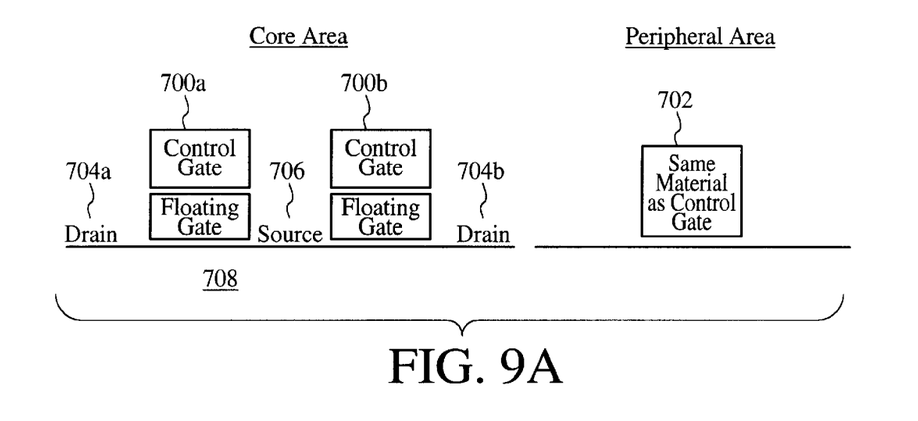
FIGS. 9A–9K illustrate the steps of the method according to the present invention.

The steps described in FIG. 8 are illustrated in FIGS. 9A–9K. Each of the FIGS. 9A–9K are allocated into two separate areas: the core area and the peripheral area. FIG. 9A illustrates step 600 of forming the stacked gate. The stacked gate includes the control gate and the floating gate, herein referred to in combination as stacked gate 700. FIG. 9A shows two stacked gates, 700a and 700b, each situated with a drain 704a, 704b and a source 706, on either side. The stacked gate 700a–700b are situated above the substrate 708. In the peripheral area, a gate 702, formed of the same material as the control gate, is also formed.

Figure 9B:
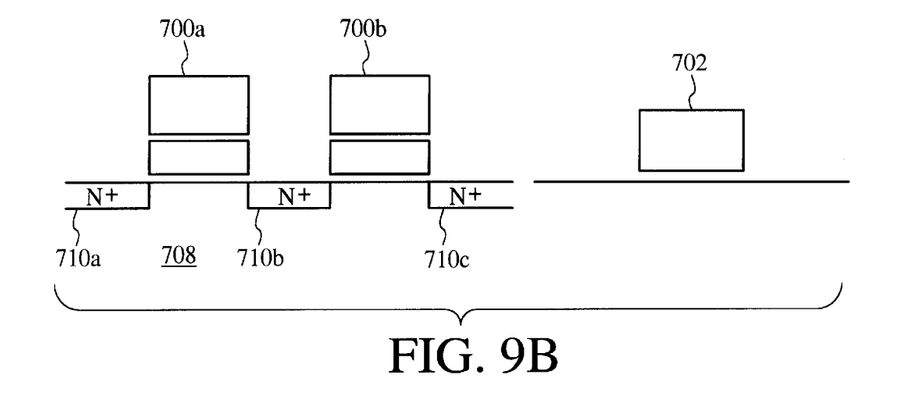
Figure 9C:
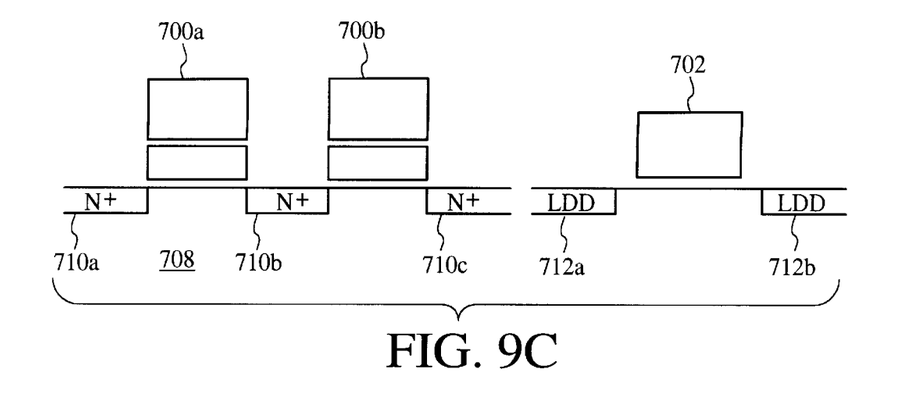

FIGS. 9B and 9C illustrate step 602 of FIG. 8 of forming the core transistor junction on the source and drain side and also performing the peripheral LDD junction in the peripheral area. FIG. 9B shows the stacked gates 700a and 700b in the core area with transistor junctions 710a–710c having been formed. In FIG. 9C, in the peripheral area, the peripheral LDD junctions 712a and 712b are shown to be formed beneath the peripheral gate 702.

Figure 9D:
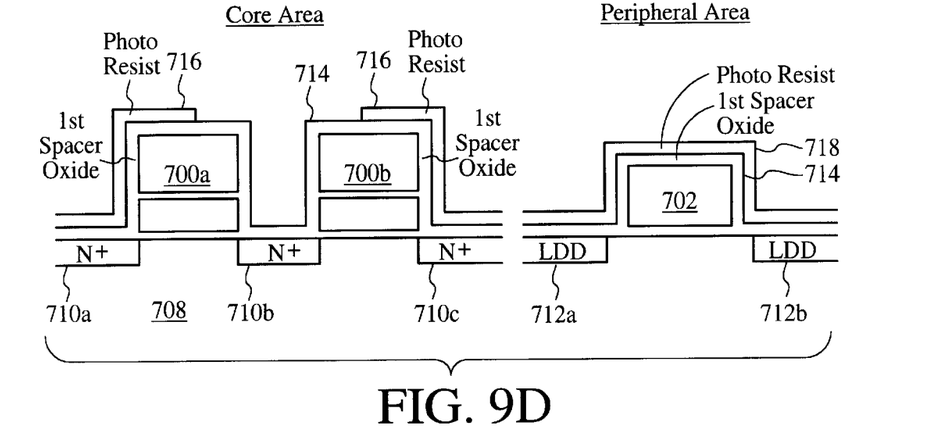
Figure 9E:
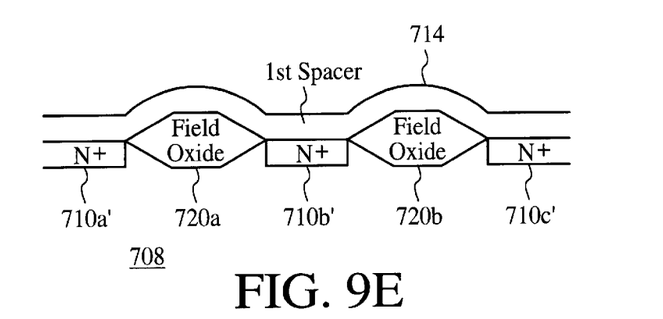

FIGS. 9D and 9E show the vertical and horizontal cross-sectional views of the memory array 100 shown in FIG. 1 for the steps 604 and 606 of FIG. 8. As shown in the vertical cross-section of the core area shown in FIG. 9D, the stacked gate 700a and 700b each have a first spacer oxide deposited over it. Additionally, portions of the stacked gates 700a and 700b and the drain area flanking the stacked gates 700a and 700b are covered in a photoresist mask 716. In the peripheral area, the gate 702 now has a first spacer oxide 714 deposited upon it, which in turn has a layer of photoresist 718 on top of it.

FIG. 9E shows a horizontal cross-section of Section 3 of the memory array 100 shown in FIG. 1. FIG. 9E also shows step 604 in which a first spacer oxide is deposited over the core and peripheral areas. Field oxides 720a and 720b are shown to have the first spacer 714 positioned above them. Between the field oxide 720a and 720b, is the core transistor junction 710b'.

Figure 9F:
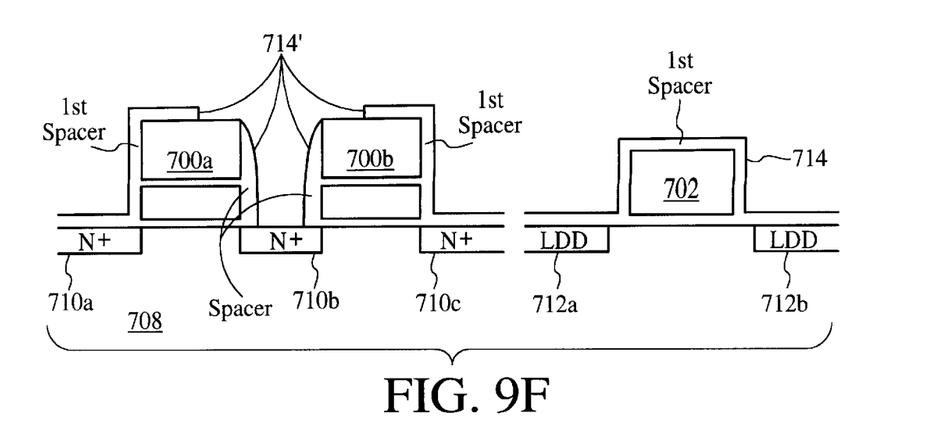
Figure 9G:
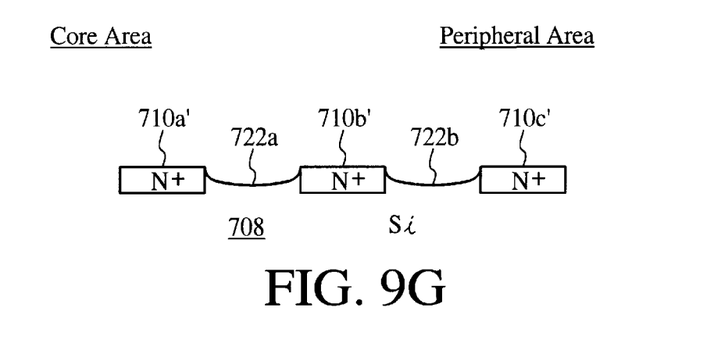

FIGS. 9F and 9G show vertical and horizontal cross-sections of the core area, in addition to a vertical cross-section of the peripheral area, illustrating that 608 of FIG. 8 in which the first spacer and the field oxide are etched at the source side in the core area. In FIG. 9F, the stacked gates 700a and 700b in the core area are shown with etched spacers 714'. In the peripheral area, the first spacer 714 remains untouched by the etching process. FIG. 9G shows a horizontal cross-section of section 3 of the memory array 100 shown in FIG. 1, in which the first spacer and the field oxide are etched at the source side in the core area via step 608 of FIG. 8. It can be seen that the field oxides 720a and 720b shown in FIG. 9E have been etched away, leaving etched gouges 722a and 722b in their place.

Figure 9H:
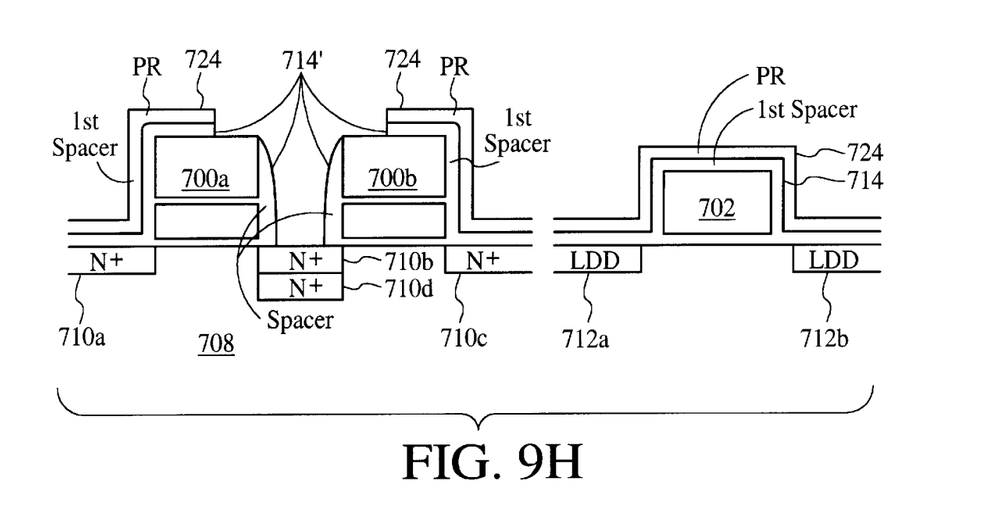
Figure 9I:
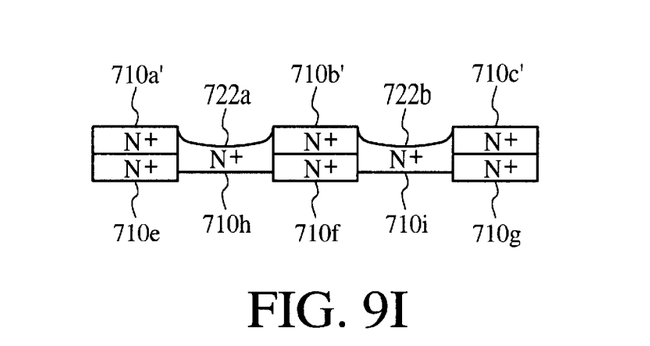

FIGS. 9H and 9I show vertical and horizontal cross-sections of the memory array 100 shown in FIG. 1 for step 610 of FIG. 8 in which the source connecting mask and implant are implemented. In FIG. 9H, the vertical cross-section of the core area shows the stacked gates 700a and 700b with the etched first spacer 714' and a layer of photoresist 724. Once the implant procedure is completed, the source area between the stacked gates 700a and 700b now includes an additional junction area 710d which thickens the junction 710b. In the peripheral area, the gate 702 and the first spacer 714 are protected through this procedure by the photoresist 724.

FIG. 9I shows a horizontal cross-section of section 3 of the memory array 100 of FIG. 1 during the source connecting mask and implant phase of step 610. In this cross-section, additional junction areas 710e–710g are added to the original transistor junctions 710a'–710c' through the additional implant of step 610. Further, transistor junctions 710h and 710i have now been formed beneath the gouged field oxide areas 722a and 722b. This source connecting mask and implant step 610 is the step in which the current connection is established. The current can now flow from the drain contact 110a of FIG. 1 through to the source contact 110c of FIG. 1. This connection is provided by the transistor junctions 710a'–710c' and 710e–10i shown in FIG. 9I.

Figure 9J:
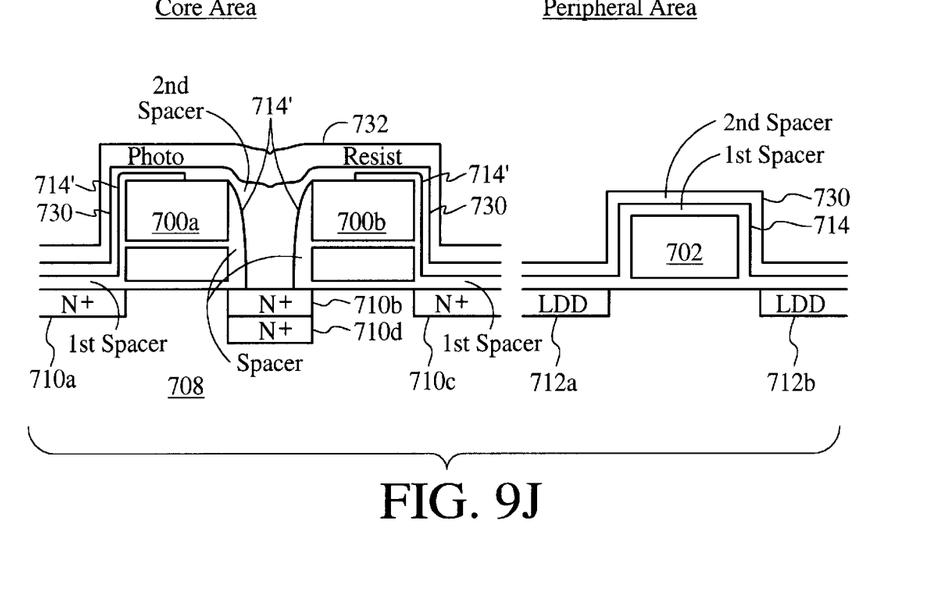

FIG. 9J illustrates steps 612 and 614 in which the second spacer oxide is deposited and the spacer oxide on the core area is masked. In the core area, the stacked gate 700a and 700b are shown with a layer of etched first spacer oxide 714', a layer of the second spacer oxide 730, and a layer of the photoresist 732. Additionally, the transistor junction 710b in the source area now includes an additional junction 710d created in the source connecting mask and implant phase in step 610. In the peripheral area, the gate 702 is now covered by a first spacer oxide layer 714 and second spacer oxide layer 730.

Figure 9K:
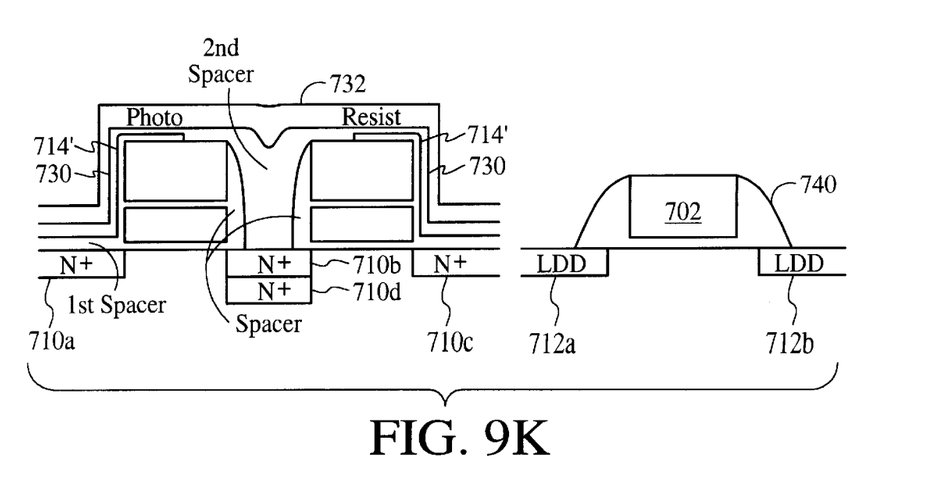

FIG. 9K illustrates step 616 of FIG. 8 in which the spacer oxide in the peripheral area is etched. In the core area, there has been no change from the core area shown in FIG. 9J. However, in the peripheral area, the gate 702 now has spacers 740 along its side caused by the etching of the first and second spacer oxide 714 and 730.

The method and device according to the present invention optimizes numerous parameters. In the core area, these parameters include desired width of the first spacer to offset damage caused by the SAS etch, eliminating silicon damage caused by the second spacer oxide etch, and avoiding uncontrollable source opening after second spacer oxide etch, which may increase the difficulty of gap filling. In the peripheral area, the parameters include the peripheral spacer width. The peripheral spacer width is typically required to be approximately 1000 Angstroms to 4000 Angstroms. The required spacer width in the peripheral area depend upon N/P channel transistor performance for electronic sensitive device (ESD) transistor protection. With this method the required spacer width in the core can be optimized independently by the second spacer oxide deposition without considering the spacer optimization in the core area. The method and device according to the present invention optimizes these parameters which can be extremely difficult to optimize as semiconductor devices become smaller.

Although the system and method has been described in accordance with the embodiments shown, one of ordinary skill in the art will readily recognize that there could be variations to the embodiments and those variations would be within the spirit and scope of the above-described system and method. Accordingly, many modifications may be made by one of ordinary skill in the art without departing from the spirit and scope of the appended claims.

What is claimed is:

1. A semiconductor device comprising:
 a core area having a first plurality of spacers with a first thickness which has been etched, the core area also including at least one gate stack;
 a peripheral area with a second plurality of spacers which has been etched and at least one electronic sensitive device (ESD) transistor, the second plurality of spacers having a second thickness, wherein the second thickness is not equal to the first thickness, the first plurality of spacers and the second plurality of spacers each including a first spacer layer and a second spacer layer, the first plurality of spacers and the second plurality of spacers being formed by depositing the first spacer layer over the core area and the peripheral area, etching the first spacer layer in the core area to form the first plurality of spacers in the core layer, depositing the second spacer layer over the core area and the peripheral area, etching the second spacer layer in the peripheral area to form the second plurality of spacers without etching the second spacer layer in the core area.

2. The device of claim 1, wherein the second thickness is greater than the first thickness.

3. The device of claim 1, wherein portions of the first spacer layer were masked prior to the etching of the first spacer layer.

4. The device of claim 1, wherein the second spacer layer includes the first spacer layer.

5. The device of claim 1, wherein the peripheral area was masked during the etching of the first spacer layer.

6. The device of claim 1, wherein the core area was masked during the etching of the second spacer layer.

* * * * *